United States Patent
Lesea

(10) Patent No.: US 10,042,131 B1
(45) Date of Patent: Aug. 7, 2018

(54) ARCHITECTURE FOR SILICON PHOTONICS ENABLING WAFER PROBE AND TEST

(71) Applicant: Xilinx, Inc., San Jose, CA (US)

(72) Inventor: Austin H. Lesea, Los Gatos, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 15/480,277

(22) Filed: Apr. 5, 2017

(51) Int. Cl.
*G02B 6/12* (2006.01)
*G02B 6/42* (2006.01)
*G02B 6/124* (2006.01)
*G02B 6/125* (2006.01)
*G02B 6/13* (2006.01)

(52) U.S. Cl.
CPC ....... *G02B 6/4227* (2013.01); *G02B 6/12004* (2013.01); *G02B 6/124* (2013.01); *G02B 6/125* (2013.01); *G02B 6/13* (2013.01); *G02B 6/4225* (2013.01); *G02B 2006/1215* (2013.01); *G02B 2006/12061* (2013.01); *G02B 2006/12147* (2013.01)

(58) Field of Classification Search
CPC ..... G02B 6/124; G02B 6/4225; G02B 6/4227
See application file for complete search history.

(56) References Cited

U.S. PATENT DOCUMENTS 9,618,699 B2 * 4/2017 Tummidi ................. G02B 6/30
2016/0246009 A1 * 8/2016 Jiang ..................... G02B 6/124

* cited by examiner

*Primary Examiner* — Omar R Rojas
(74) *Attorney, Agent, or Firm* — Carleton Clauss

(57) ABSTRACT

Embodiments herein describe techniques for testing or aligning optical components in a photonic chip using a grating coupler. In one embodiment, the photonic chip may include an edge coupler and a grating coupler for optically coupling the photonic chip to external fiber optic cables. The edge coupler may be disposed on a side or edge of the photonic chip while the grating coupler is located on a top or side of the photonic chip. During fabrication, the edge coupler may be inaccessible. Instead of using the edge coupler to test the photonic chip, a testing apparatus can use the grating coupler along with a splitter to transfer optical test signals between an optical component in the photonic chip (e.g., a modulator or detector) and a test probe optically coupled to the grating coupler.

20 Claims, 8 Drawing Sheets

ARCHITECTURE FOR SILICON PHOTONICS ENABLING WAFER PROBE AND TEST

TECHNICAL FIELD

Examples of the present disclosure generally relate to testing optical components in a photonic chip and, in particular, to using a grating coupler to verify the function of an optical component integrated into the photonic chip.

BACKGROUND

Many network devices process data at a rate where using a conductive cable impractical. For example, the I/O rate of the network device may mean that it requires too much power or introduces too much noise to use a conductive cable (e.g., an Ethernet cable). Thus, if high speed signals need to be transferred between network devices, the devices may use fiber optic cables which can accommodate much higher data rates at much greater distances than conductive cables.

The network devices can include one or more photonic chips which couple to the optical cables. For example, a photonic chip can couple to over hundred different fiber optical cables. However, testing optical components in the photonic chips can be difficult if not impossible until the photonic chips have been mounted and aligned to the optical cables. For example, it may be impossible to test the optical components in the photonic chips (e.g., optical modulators, optical detectors, and the like) while the photonic chips are still in a wafer—i.e., before the wafer is sawed into individual photonic chips.

SUMMARY

Techniques for testing optical components in a photonic semiconductor chip using grating couplers are described. One example is photonic semiconductor chip that includes an edge coupler coupled to a first end of a first waveguide where the edge coupler is arranged to transfer first optical signals along a side plane of the photonic semiconductor chip and wherein the edge coupler is configured to change a mode size as the first optical signals propagate through the edge coupler. The photonic semiconductor chip also includes a splitter coupled to (i) a second end of the first waveguide, (ii) a first end of a second waveguide, and (iii) a first end of a third waveguide and is configured to receive a first optical signal from one of the first, second, and third waveguides and transmit first and second attenuated portions of the first optical signal onto the remaining two of the first, second, and third waveguides. The photonic semiconductor chip includes a grating coupler coupled to a second end of the second waveguide, wherein the grating coupler is arranged to transfer second optical signals along a top plane of the photonic semiconductor chip that is perpendicular to the side plane and an optical component coupled to a second end of the third waveguide.

Another example is method that includes providing a photonic semiconductor chip including an edge coupler, a grating coupler, a splitter, and an optical component. The edge coupler is coupled to a first end of a first waveguide, the splitter is coupled to (i) a second end of the first waveguide, (ii) a first end of a second waveguide, and (iii) a first end of a third waveguide, the grating coupler is coupled to a second end of the second waveguide, and the optical component is coupled to a second end of the third waveguide. The method includes transferring an optical signal between a test probe and the grating coupler where the edge coupler is arranged to transfer first optical signals along a side plane of the photonic semiconductor chip and the grating coupler is arranged to transfer second optical signals along a top plane of the photonic semiconductor chip that is perpendicular to the side plane. The method includes testing the functionality of the optical component based on transferring the optical signal.

Another example is a method that includes providing a wafer comprising a plurality of photonic chips integrated into the wafer where a first photonic chip of the plurality of photonic chips includes a grating coupler, a splitter, a first optical component, and a second optical component. The grating coupler is coupled to a first end of a first waveguide, the splitter is coupled to (i) a second end of the first waveguide, (ii) a first end of a second waveguide, and (iii) a first end of a third waveguide, the first optical component is coupled to a second end of the second waveguide, and the second optical component is coupled to a second end of the third waveguide. The method includes transferring an optical signal between a test probe and the grating coupler where the grating coupler is arranged to transfer the optical signal along a top plane of the first photonic chip that is parallel to a common plane on which the first and second waveguides are disposed. The method includes testing the functionality of the first optical component based on transferring the optical signal and cutting the wafer to separate the first photonic chip from the plurality of photonic chips.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Figure 1:
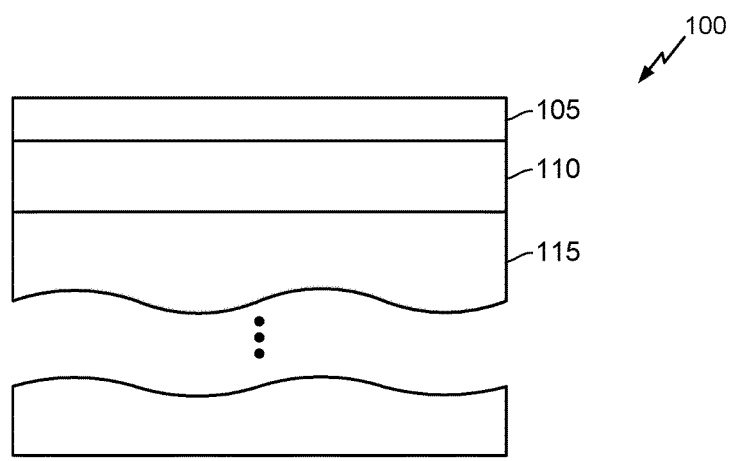
FIG. 1 illustrates a SOI device, according to one embodiment disclosed herein.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the description or as a limitation on the scope of the claims. In addition, an illustrated example need not have all the aspects or advantages shown. An aspect or an advantage described in conjunction with a particular example is not necessarily limited to that example and can be practiced in any other examples even if not so illustrated, or if not so explicitly described.

Embodiments herein describe techniques for testing or aligning optical components in a photonic chip using a grating coupler. In one embodiment, the photonic chip may include an edge coupler and a grating coupler for optically coupling the photonic chip to external fiber optic cables. The edge coupler may be disposed on a side or edge of the photonic chip while the grating coupler is located on a top or side of the photonic chip. For example, the edge coupler may be disposed on a side of the photonic chip that is perpendicular to a side of the chip that includes the grating coupler. Generally, edge couplers are more efficient at transmitting light into and out of the photonic chip than grating couplers. Moreover, aligning external fiber optic cables to edge couplers may result in more compact packaging than grating couplers.

While edge couplers have advantages over grating couplers, the edge couplers may be inaccessible during some fabrication steps which may mean the optical components connected to the edge couplers cannot be tested. During fabrication, a wafer may be processed to include multiple copies of a photonic chip. For example, a wafer may include 20-200 photonic chips. Before the wafer is cut to separate the photonic chips, the manufacture may want to test the optical components in the photonic chips, but if these components are accessible using edge couplers, the components cannot be tested until the wafer has been diced or sawed into individual photonic chips.

In embodiments described herein, a photonic chip includes a grating coupler for testing optical components connected to an edge coupler. Thus, when an edge coupler is inaccessible (e.g., before a wafer is sawed), a test probe can be optically connected to the grating coupler which is located at the top or bottom of the wafer, and thus, may be accessible. The test probe can receive optical signals from the grating coupler or transmit optical signals into the grating coupler in order to test the functionality of the photonic chip. In one embodiment, the grating coupler and the edge coupler are connected to respective ports of a splitter. A third port of the splitter is coupled to an optical component in the photonic chip (e.g., an optical modulator, optical detector, and the like). When receiving an optical signal from the optical component, the splitter forwards a first attenuated portion of the power of the optical signal to the edge coupler and a second attenuated portion of the power to the grating coupler. Thus, even if the edge coupler is not exposed or is inaccessible, the test probe can receive a percentage of the optical signal via the grating coupler to test the functionality of the optical component.

Moreover, the test probe can also transmit an optical signal into the photonic chip using the grating coupler. Here, the optical signal is transmitted from the grating coupler to the splitter which forwards at least a portion of the signal to the optical component. In one embodiment, the optical component may output an electrical signal which can be coupled to a conductive pad on the top or bottom surface of the photonic chip. By coupling a test probe to the conductive pad and measuring the electrical signal, a testing apparatus can determine whether the photonic chip is functional.

In one embodiment, the grating couplers are used for testing after the wafer is sawed into individual photonic chips. Thus, the same testing apparatus and set up used to test the photonic chips when disposed in a wafer can be used to test the individual photonic chips when mounted on respective substrates. Further, in one embodiment, the grating coupler is used to align a fiber optic cable to the edge coupler in the photonic chip. For example, during alignment, the fiber optical cable may transmit light into the edge coupler. By monitoring the light received via the grating coupler, an alignment apparatus can determine when the fiber optic cable is aligned with the edge coupler—e.g., when the light received from the grating coupler is at a maximum.

FIG. 1 illustrates a (silicon-on-insulator) SOI device 100, according to one embodiment disclosed herein. SOI device 100 includes a surface layer 105, a buried insulation layer 110 (also referred to as buried oxide (BOX) layer), and a semiconductor substrate 115. Although the embodiments herein refer to the surface layer 105 and substrate 115 as silicon, the disclosure is not limited to such. For example, other semiconductors or optically transmissive materials may be used to form the structure shown here. Moreover, the surface layer 105 and the substrate 115 may be made of the same material, but in other embodiments, these layers 105, 115 may be made from different materials.

The thickness of the surface layer 105 may range from less than 100 nanometers to greater than a micron. More specifically, the surface layer 105 may be between 100-300 nanometers thick. The thickness of the insulation layer 110 may vary depending on the desired application. In one embodiment, the thickness of insulation layer 110 may range from less than one micron to tens of microns. The thickness of the substrate 115 may vary widely depending on the specific application of the SOI device 100. For example, the substrate 115 may be the thickness of a typical semiconductor wafer (e.g., 100-700 microns) or may be thinned and mounted on another substrate.

For optical applications, the silicon surface layer 105 and insulation layer 110 (e.g., silicon dioxide, silicon oxynitride, and the like) may provide contrasting refractive indexes that confine an optical signal in a silicon waveguide in the surface layer 105. In a later processing step, the surface layer 105 of the SOI device 100 may be etched to form one or more silicon waveguides. Because silicon has a higher refractive index compared to an insulator such as silicon dioxide, the optical signal remains primarily in the waveguide as it propagates across the surface layer 105.

Figure 2:
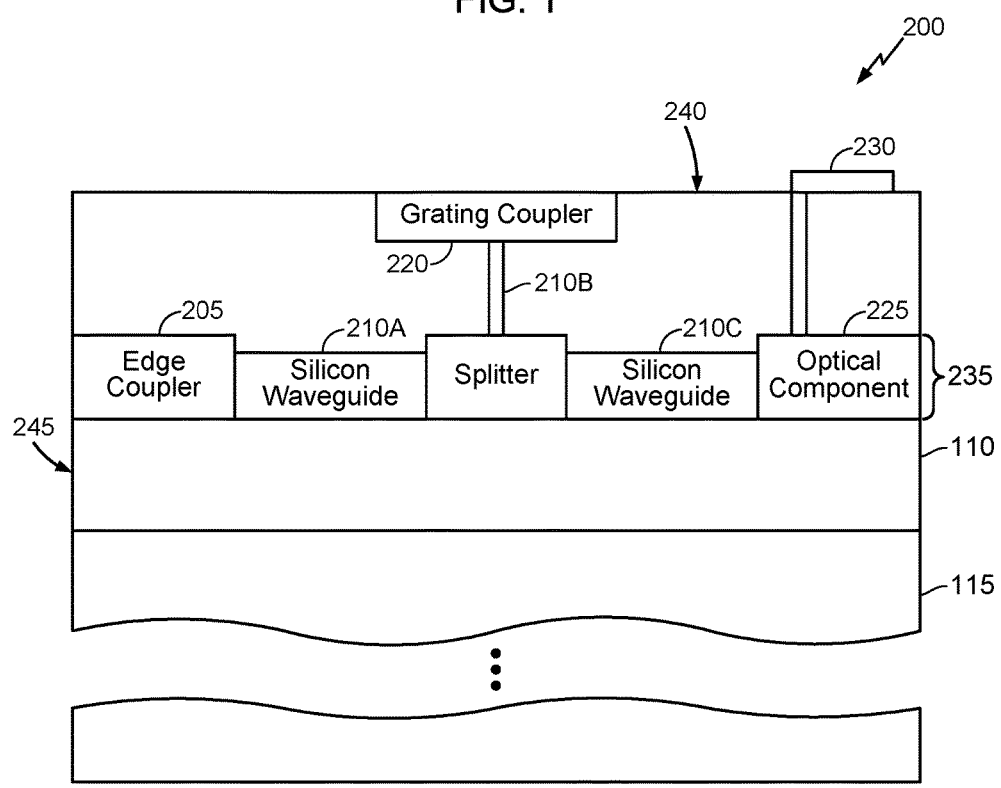
FIG. 2 illustrates a photonic chip that includes a grating coupler for testing optical components, according to an example.

FIG. 2 illustrates a photonic semiconductor chip 200 formed from an SOI structure. The photonic chip 200 includes an edge coupler 205, a grating coupler 220, and an optical component 225 coupled to a splitter 215 using respective silicon waveguides 210A-C. Like the SOI device 100 in FIG. 1, photonic chip 200 includes a top surface layer 235, the insulation layer 110, and the substrate 115. However, the surface layer 235 has been processed to include various optical structures. For example, surface layer 235 includes an optical component 225 (e.g., an optical modulator or optical detector) with a conductive pad 230 exposed on a top surface 240 of the photonic chip 200. The optical component 225 may be formed by performing various fabrication steps on the silicon layer such as etching or doping the silicon material as well as depositing or growing additional materials onto surface layer 235. The conductive pad 230 represents any number of pads or contacts that can be used to transmit electrical signals generated by, or transmitted to, the optical component 225. The conductive pad 230 is coupled to the optical component by a conductive trace or via.

If the optical component 225 is a modulator, the conductive pad 230 may receive control signals from an external source for controlling the modulation of optical signals received from the waveguide 210C. If the optical component 225 is an optical detector, the detector may have n-type and p-type doped regions coupled to respective conductive pads 230 for generating or transmitting electrical signals that correspond to the absorbed optical signal received from the silicon waveguide 210C.

Although not shown, the conductive pad 230 may be connected to an electrical integrated circuit (IC) that receives electrical signals from, or transmits electrical signals to, the optical component 225. In one embodiment, the electrical IC is physically separate from the photonic chip 200 but couples to the conductive pad 230 via a bond wire and/or a bus. In another embodiment, the logic in the electrical IC is formed in the same SOI structure of the photonic chip 200. Thus, instead of using conductive pad 230, the optical component 225 can transmit and receive data signal to the logic using an internal trace or wire.

The silicon waveguides 210 may be fabricated from a silicon surface layer (e.g., layer 105 of FIG. 1). The photonic chip 200 uses the waveguides 210 to carry an optical signal to different areas of the surface layer 235. In this example, the silicon waveguides 210 transmit optical signals between the edge couplers 205, the splitter 215, the grating coupler 220, and the optical component 225. Although the waveguide 210B is shown extending vertically from the splitter 215 to the grating coupler 220 this is for illustration purposes only. The waveguide 210B and the grating coupler 220 may be disposed on the same plane and layer (i.e., surface layer 235) as the waveguides 210A and 210C, the splitter 215, the edge coupler 205, and the optical component 225. For example, the waveguide 210B may extend in a direction into or out of the page so the waveguide 210B and the grating coupler 220 are in the surface layer 235. Nonetheless, the grating coupler 220 has at least one side exposed on the top surface 240 of the photonic chip 200. That is, the grating coupler 220 may extend from the insulation layer 110 to the top surface 240.

As shown, one interface of the edge coupler 205 is coupled to the waveguide 210A while another interface is proximate to an external side surface 245 of the photonic chip 200. Although the edge coupler 205 is shown as being exposed on the side surface of the chip 200, in other embodiments the edge coupler 205 may be recessed slightly from the side surface 245. In one embodiment, the edge coupler 205 is made of the same material as the waveguides 210. For example, the edge coupler 205 and the waveguides 210 may both be made of silicon. In one embodiment, the edge coupler 205 may include a plurality of stacked layers that are processed (e.g., etched) such that an optical signal striking the exposed side surface 245 of the converter is focused into the waveguide 210A.

The edge coupler 205 may be designed to efficiently couple to an external light-carrying medium (e.g., a laser or fiber optic cable). Because the dimensions of the silicon waveguides 210 may result in high optical losses if directly connected to the external light-carrying medium, the light-carrying medium may instead be coupled to the edge coupler 205 which then transfers the signal into the silicon waveguide 210A. Doing so may eliminate the need for using lenses between the external light-carrying medium and the waveguide 210A which focus the optical signal into a mode with a diameter similar to the dimensions of the waveguide 210A. Stated differently, in one embodiment, the edge coupler 205 may permit the external light-carrying medium to be butt-coupled to the side surface 245 and transmit light directly into photonic chip 200 without the addition of external focusing elements such as lenses.

The splitter 215 represents any optical coupler that can receive an optical signal at a first input and output attenuated optical signals at two or more outputs. In one embodiment, the splitter 215 receives light from the edge coupler 205 via the waveguide 210A and splits the received optical power to output respective optical signals to the grating coupler 220 and the optical component 225. That is, a first attenuated portion of the power in the received optical signal is transmitted to the grating coupler 220 while a second attenuated portion of the power in the received optical signal is transmitted to the optical component 225. For example, the splitter 215 may be a 20 dB coupler where 1% of the received power is transmitted to the grating coupler 220 and 99% of the received power is transmitted to the optical component 225.

In one embodiment, the splitter 215 is multidirectional such that output ports can be used as input ports and input port can be used as output ports. For example, continuing the example above, the splitter 215 can receive an optical signal from optical component 225 via the waveguide 210C. The splitter 215 may forward a first percentage of the received optical power to the edge coupler 205 and a second percentage of the optical signal to the grating coupler 220. The splitter 215 may perform a similar optical split for optical signals received from the grating coupler 220 via the waveguide 210B.

In another embodiment, the splitter 215 may be unidirectional. That is, the splitter 215 may only split light that is received at one input port but not when the light is received at a different port. In another embodiment, the splitter 215 may separate TE light from TM light in a received optical signal which are then forwarded using respective optical ports. In yet another embodiment, the splitter 215 may include an optical circulator for splitting the light between at least two output ports in a unidirectional manner.

As describe in more detail below, the grating coupler 220 and the splitter 215 permit the optical component 225 to be tested before a wafer containing the photonic chip 200 has been sawed in order to expose the edge coupler 205 at the side surface 245 (i.e., before the edge coupler 205 is accessible). Light can be transmitted into the grating coupler 220, which is then forwarded to the optical component 225 using the splitter 215, or light can be received from the grating coupler 220 at a testing apparatus in response to the splitter 215 receiving an optical signal from the optical component 225. Further, after the photonic chip 200 has been sawed from the wafer (and the edge coupler 205 is now accessible), the chip 200 can again be tested using the grating coupler 220 without having to couple the edge coupler 205 to a light-carrying medium. Moreover, the grating coupler 220 can be used when aligning a light-carrying medium to the edge coupler 205.

Figure 3A:
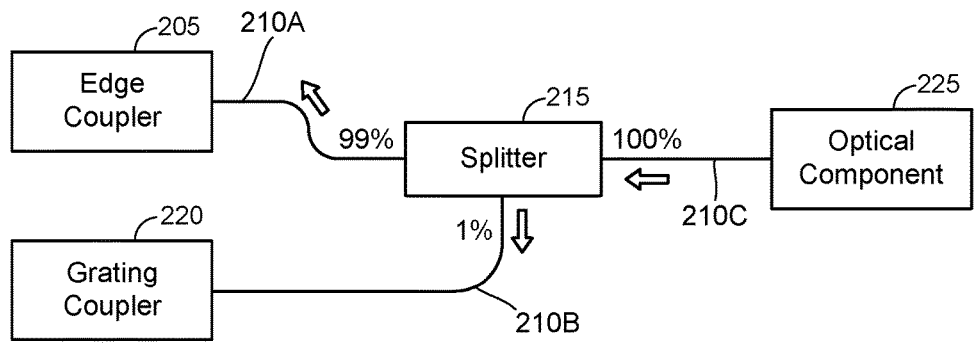
FIGS. 3A-3C illustrate a splitter optically coupling a grating coupler and an edge coupler to an optical component, according to an example.
Figure 3B:
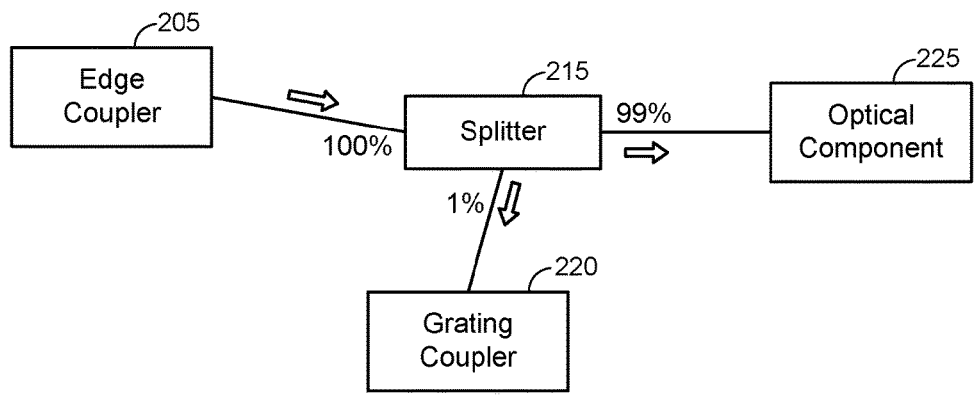
Figure 3C:
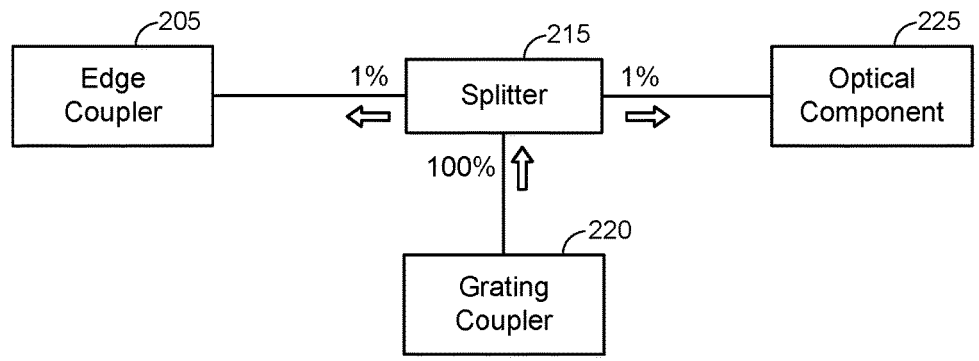

FIGS. 3A-3C illustrate the splitter 215 optically coupling the grating coupler 220 and the edge coupler 205 to the optical component 225, according to an example. Although FIGS. 3A-3C illustrates a splitter 215 with a 20 dB coupler, any type of splitting ratio can be used, e.g., a 10 dB or 30 dB coupler.

In FIG. 3A, an optical signal is transmitted from the optical component 225 via the waveguide 210C to the splitter 215. In this example, the splitter 215 is a 20 dB coupler which forwards 1% of the power of the optical signal received from the optical component 225 to the grating coupler 220 and 99% of the received power to the edge coupler 205. This split may occur during testing as well as during operation. When testing the photonic chip, a test probe can be optically coupled to the grating coupler 220 to receive the optical signal provided by the splitter 215 (albeit with a 20 dB attenuation). A testing apparatus can evaluate the received optical signal to determine if the optical component 225 is functioning as expected. Although the grating coupler 220 receives only 1% of the power in this example, the testing apparatus may include an optical amplifier for increasing the power of the optical signal received from via the grating coupler 220 to match (or exceed) the power of the optical signal transmitted from the optical component 225 to the splitter 215.

In one embodiment, during operation (e.g., after the function of the photonic chip is verified and the edge couplers 205 has been coupled to a fiber optic cable), 1 of the power transmitted by the optical component 225 is still forwarded through the grating coupler 220. In one embodiment, the grating coupler 220 is used only when testing the photonic chip or when aligning the edge coupler 205, and thus, the signal forwarded to the grating couplers 220 during operation is unused. Put differently, during operation, the grating coupler 220 may not be coupled to an external light carrying medium. However, the advantages of using the grating coupler 220 to ensure proper functionality of the photonic chip and/or align the edge coupler 205 may outweigh the fact that 1% of the power of the signal transmitted by the optical component 225 is sent to the grating coupler 220 rather than the edge coupler 205 during operation. However, in another embodiment, the grating coupler 220 may be coupled to fiber optic cable during operation. For example, the grating coupler 220 can transmit an optical signal for calibrating the photonic chip during operation.

In FIG. 3B, an optical signal is transmitted by the edge coupler 205 to the splitter 215 which then forwards 99% of the power of the optical signal to the optical component 225 and 1% of the power to the grating coupler 220. In one example, FIG. 3B illustrates a state of the photonic chip when the edge coupler 205 is being aligned to an external fiber optic cable. The grating coupler 220 may be optically coupled to a test probe which receives and monitors the optical signal transmitted through the grating coupler 220. The positional relationship between the optic fiber cable and the edge coupler 205 can be changed until the light received from the grating coupler 220 is at a maximum, thereby indicating the optimal alignment between the components. After alignment and during operation, the grating coupler 220 may be covered up and is not accessible. As such, the 1% power forwarded by the splitter 215 to the coupler 220 may be lost or unused. However, the advantages of using the grating coupler 220 may outweigh the fact that 1% of the power of the signal transmitted by the edge coupler 205 is sent to the grating coupler 220 rather than the optical component 225 during operation.

In FIG. 3C, the grating coupler 220 transmits an optical signal to the splitter 215 which in turn forwards 1% of the power of the optical signal to the edge coupler 205 and 1% of the optical power to the optical component 225. Although the splitter 215 transmits only 1% of the optical power received from the grating coupler 220 to the edge coupler 205 and optical component 225, the optical signal transmitted by a test probe into the grating coupler 220 may be 100 times more powerful than what is used in the photonic chip during operation. Thus, after being attenuated by the splitter 215, the optical signals transmitted to the edge coupler 205 and the optical component 225 have the same power as the optical signals that will be used during operation. In this manner, the grating coupler 220 can be used to introduce optical signals to test the functionality of the optical component 225 with the same or similar optical power as the optical signals that are used during normal operation.

In one embodiment, the grating coupler 220 is used to transmit optical signals into the photonic chip only when testing the functionality of the photonic chip. Thus, the grating coupler 220 may be covered up or not connected to an external light carrying medium. However, in another embodiment, the grating coupler 220 may be permanently attached to a fiber optic cable so that the grating coupler 220 can be used to transmit light into the photonic chip during normal operation.

Figure 4A:
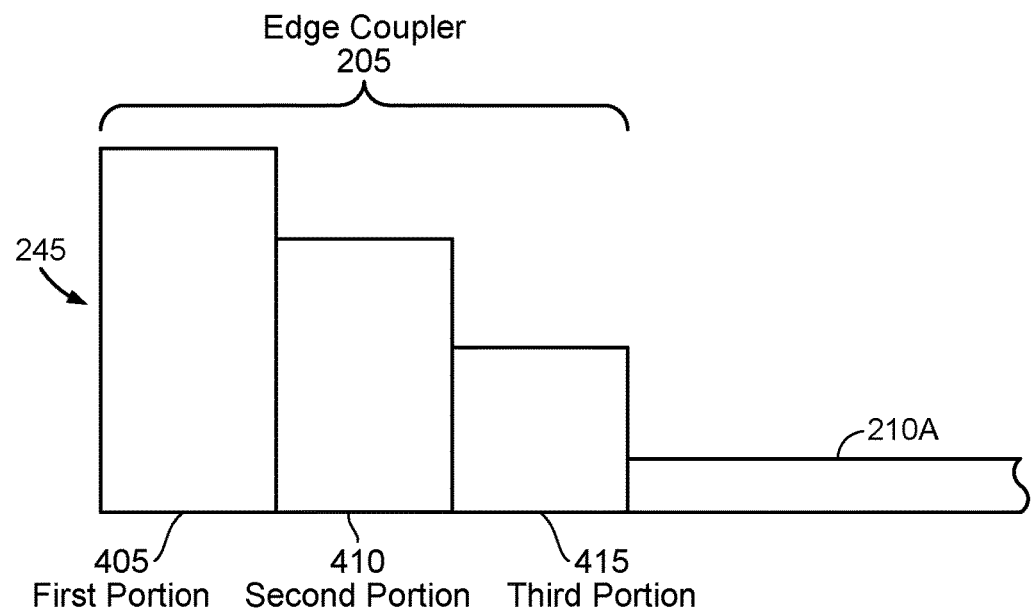
FIGS. 4A and 4B illustrate an edge coupler, according to an example.
Figure 4B:
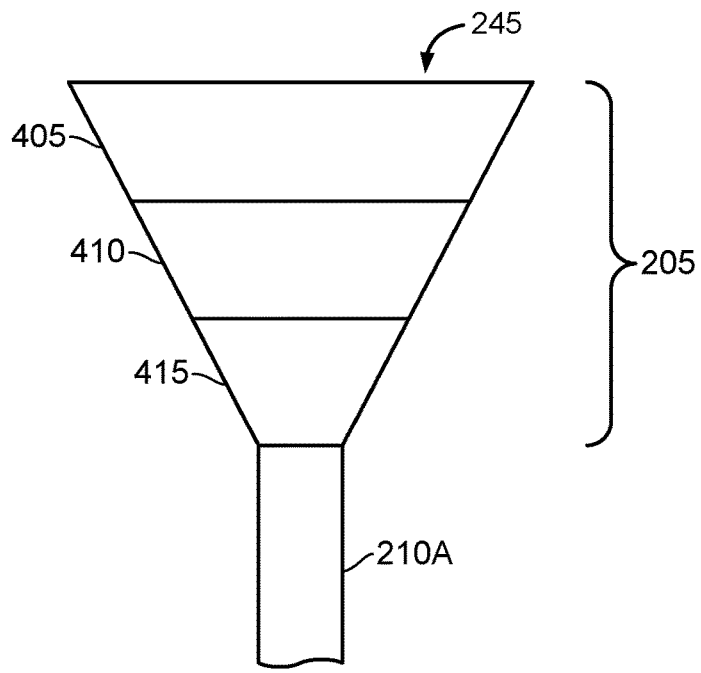

FIGS. 4A and 4B illustrate the edge coupler 205, according to an example. FIG. 4A is a side view of the edge coupler 205 while FIG. 4B is a top view of the edge coupler 205. As shown in FIG. 4A, the edge coupler 205 includes three portions: a first portion 405 at the side surface 245 of the photonic chip, a second portion 410, and a third portion 415 that is coupled to the silicon waveguide 210A. The height of the first portion 405 is greater than the height of the second portion 410 which in turn is greater than the height of the third portion 415. The changing height can increase the mode size of an optical signal transmitted into, or from, the silicon waveguide 210A. For example, an optical fiber aligned to the edge coupler 205 at the side surface 245 may have a core with a dimension of approximately 9 microns. If the optical fiber is a single mode fiber, the mode may also have a size of roughly 9 microns. However, as the optical signal is transmitted through the edge coupler 205, the change in height of the portions shrink the mode size to better match the dimensions of the silicon waveguide 210A which may have a height less than a micron. The reverse is true for signals that are transmitted from the silicon waveguide 210A to the optical fiber disposed at the side surface 245. In that case, the changing heights of the first, second, and third portions 405, 410, and 415 increase the mode size to better match the dimensions of the core of the optical fiber.

The top view shown in FIG. 4B illustrates that the width of the edge coupler 205 tapers as the coupler extends from the side surface 245 to the silicon waveguide 210A. That is, the first portion 405 has a larger width than the second portion 410 which in turn has a larger width than the third portion 415. The width, like the height, can change the mode size of the optical signal transmitted through the edge coupler 205. For example, the width of the core of the fiber may between 8-10 microns while the width of the silicon waveguide 210A is less than a micron.

The edge coupler 205 illustrated in FIGS. 4A and 4B illustrate just one example of an edge coupler. The embodiments herein can be used with any edge coupler which permits an external light carrying medium (whether a fiber optic cable or a laser) to transmit or receive light with a waveguide (e.g., a sub-micron waveguide).

Figure 5:
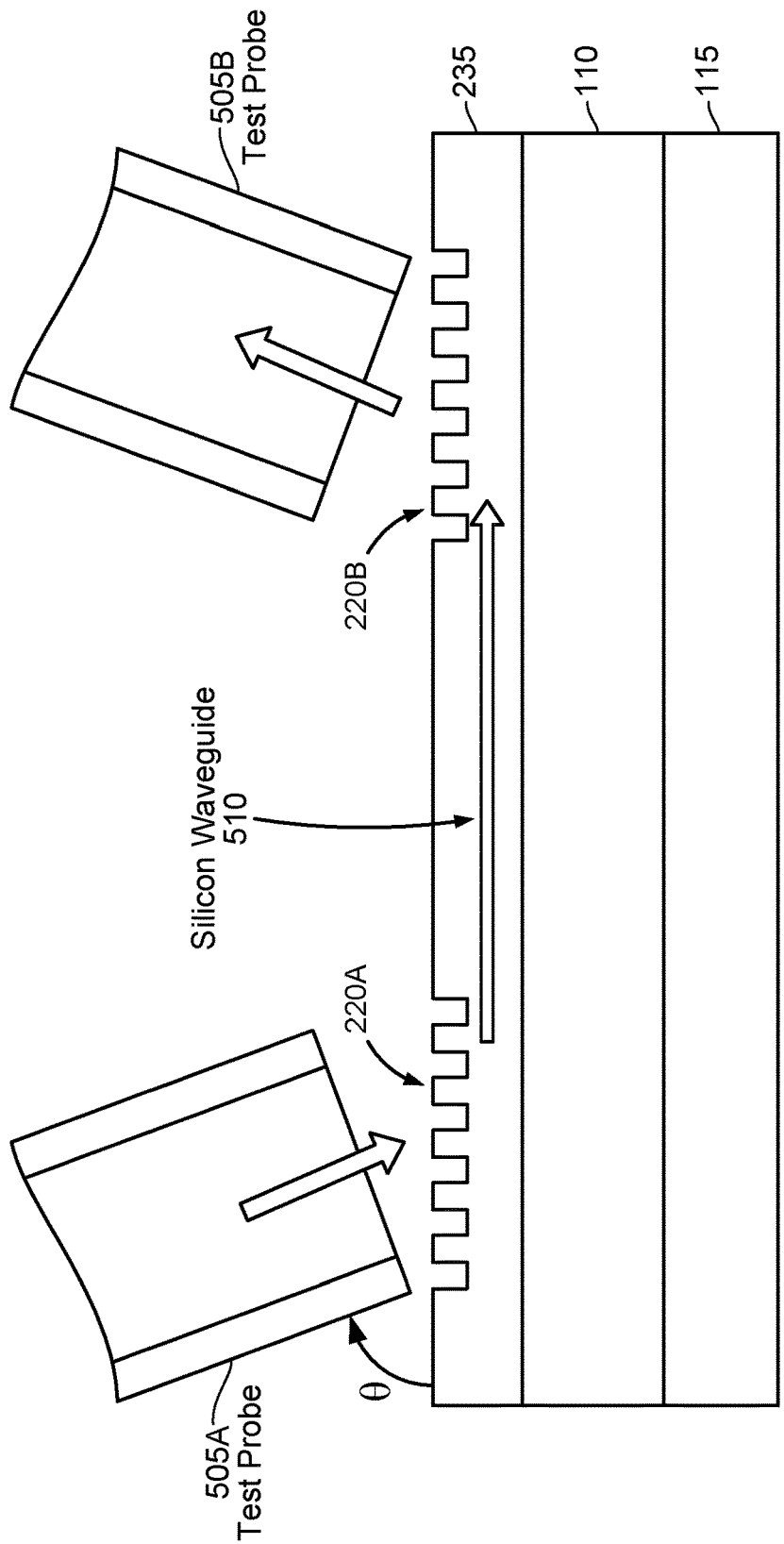
FIG. 5 illustrates grating couplers in a silicon-on-insulator structure, according to an example.

FIG. 5 illustrates grating couplers 220 in a silicon-on-insulator structure, according to an example. Specifically, FIG. 5 illustrates a first grating coupler 220A and a second grating coupler 220B each optically coupled to a respective test probe 505. As shown, each test probe 505 is offset 80 degrees from the top of the surface layer 235 as shown by the angle θ. This offset angle θ permits the light transmitted from the test probe 505A (e.g., a fiber optic cable) to enter the grating coupler 220A and propagate along a silicon waveguide 510. To do so, the grating coupler 220A includes a saw-tooth pattern which directs the light received from the test probe 505A into the silicon waveguide 510. The grating coupler 220B directs the light received from the silicon waveguide 510 at the offset angle θ into the test probe 505B. Of course, the process can be reversed where the test probe 505B transmits light into the grating coupler 220B which directs that light into the silicon waveguide 510. The grating coupler 220A then transmits the light at the offset angle θ into the test probe 505A. In this manner, each of the grating couplers 220 can be used to transmit and receive optical signals.

In one embodiment, a transparent alignment apparatus may be disposed between the test probes 505 and the grating couplers 220. For example, the test probes 505 may be inserted into grooves (e.g., V-grooves or U-grooves) in the alignment apparatuses that are parallel to the surface layer 235. The alignment apparatuses can include reflective surfaces that direct the light emitted from the test probes 505 into the grating couplers 220 at the offset angle θ or direct light emitted from the grating couplers 220 into the test probes 505.

The grating couplers 220 shown in FIG. 5 are just one example of a grating coupler. The embodiments herein can be used with any grating coupler that can be manufactured on a top or bottom surface of a photonic chip to permit a test probe to transmit light into, or receive light from, a waveguide that extends parallel to the surface layer 235. That is, the grating coupler 220 permits a test probe to transmit light into or receive light from the waveguides even though the test probe (or an alignment apparatus) is not parallel with the waveguide (e.g., at an 80 degree offset). In this manner, the grating coupler 220 redirects optical signals so that the optical signals pass through a surface that is parallel with the waveguide 510.

Figure 6:
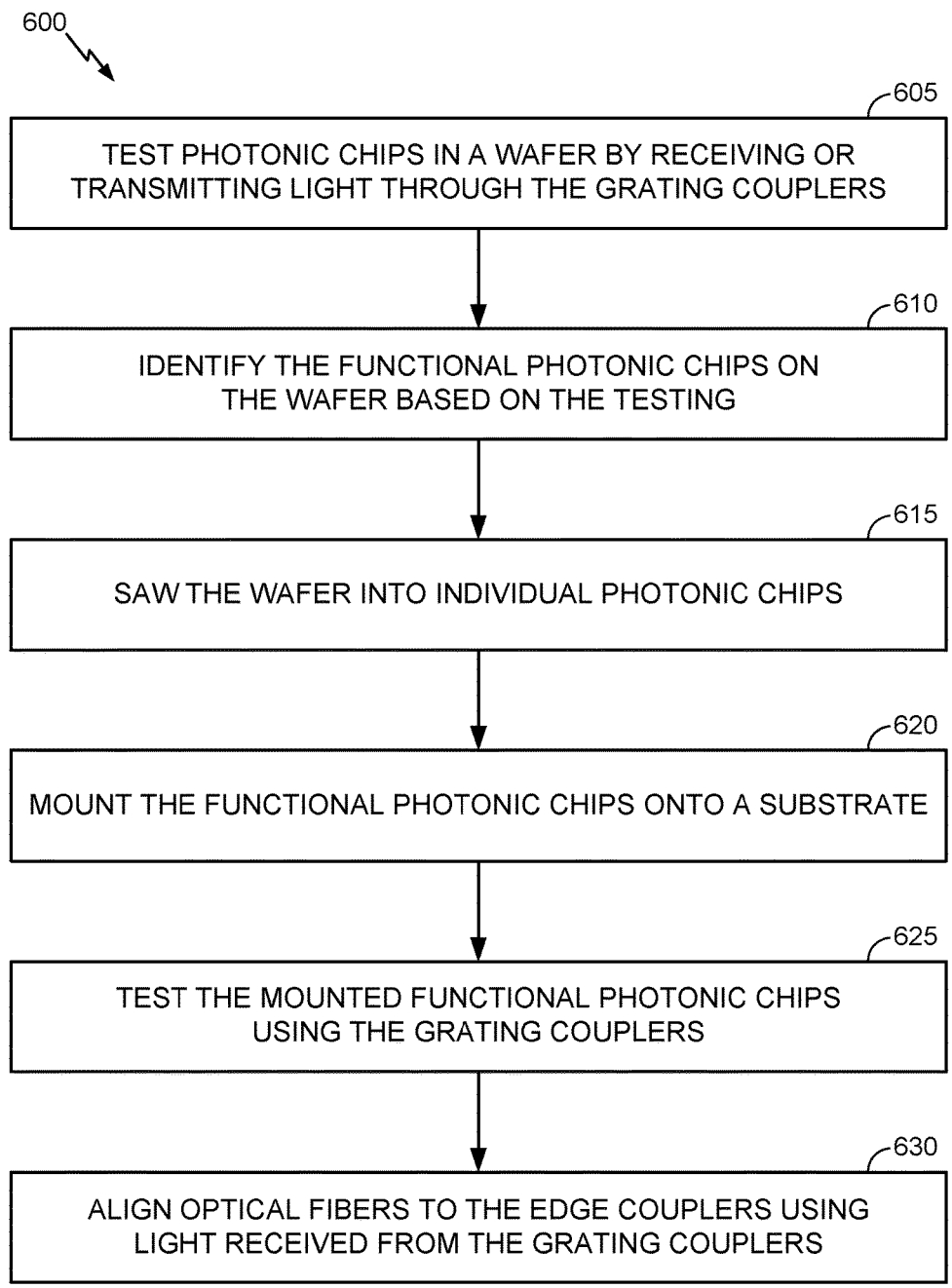
FIG. 6 is a flowchart for testing a photonic chip using a grating coupler, according to an example.

FIG. 6 is a flowchart of a method 600 for testing a photonic chip using a grating coupler, according to an example. At block 605, a testing apparatus tests photonic chips in a wafer by receiving or transmitting light through the grating couplers. In one embodiment, the testing apparatus includes a test probe which receives optical light through the grating coupler that was generated or altered by an optical component in the photonic chip. The testing apparatus may check whether the received light has an expected power, phase, frequency, or intensity or whether the light carries expected data (when demodulated). For example, the testing apparatus may check only if the received light has a threshold intensity at a particular frequency, or the testing apparatus may determine whether data carried in the received optical signal contains expected modulated data.

In one embodiment, the testing apparatus drives electrical signals into the photonic chip using conductive pads which control an optical component in the photonic chip such as a modulator. The testing apparatus may ensure that the optical signals received from the optical component via the grating coupler match what is expected when controlling the component using the electrical signals.

In another embodiment, the testing apparatus may receive electrical signals from the photonic chip that are generated in response to the testing apparatus transmitting an optical signal into the photonic chip. For example, the grating coupler (and a splitter) may forward the optical signal received from the testing apparatus to an optical detector which converts the optical signal into electrical signals. By monitoring the electrical signals, the testing apparatus can determine if the electrical signals where properly generated by the detector. If so, the testing apparatus stores an indication that the photonic chip (or the optical component in the photonic chip) is functional. If not, the testing apparatus indicates the photonic chip is nonfunctional.

In one embodiment, testing the functionality of the photonic chip includes calibrating an optical component in the photonic chip. For example, depending on the intensity or power of the light received from a grating coupler, the testing apparatus may change control data stored in a memory element in the photonic chip (or an electrical IC coupled to the photonic chip) which changes the optical output of the optical component to the desired intensity or power.

Figure 7:
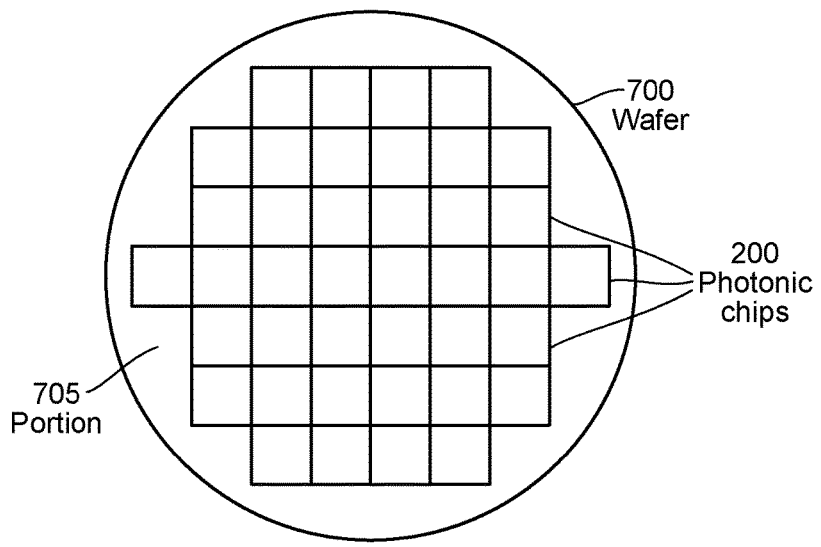
FIG. 7 illustrates a wafer including multiple photonic chips, according to an example.

FIG. 7 illustrates a wafer 700 including multiple photonic chips 200, according to an example. In one embodiment, block 605 of method 600 is performed when the photonic chips 200 are disposed in the wafer 700. As such, any edge couplers in the photonic chips 200 are covered up by neighboring photonic chips or unused portions 705 of the wafer 700. In this state of fabrication, the edge couplers in the chips 200 may be inaccessible to an external light carrying medium. The wafer 700 can be sawed to separate the photonic chips 200 into individual components. Moreover, sawing the wafer can expose edge couplers on one or more side surfaces in the photonic chips 200. Although sawing is described, the wafer 700 can be cut into the individual photonic chips 200 using any suitable process, e.g., sawing, dicing, cleaving, etc.

In one embodiment, the photonic chips 200 are formed using the same process steps, and thus, have the same structure and components. That is, the photonic chips 200 are copies of each other. However, the embodiments herein are not limited to such and can be applied to a wafer 700 that has different chips where one or more fabrication steps are performed on some of the chips in the wafer 700 but not on others.

Figure 8:
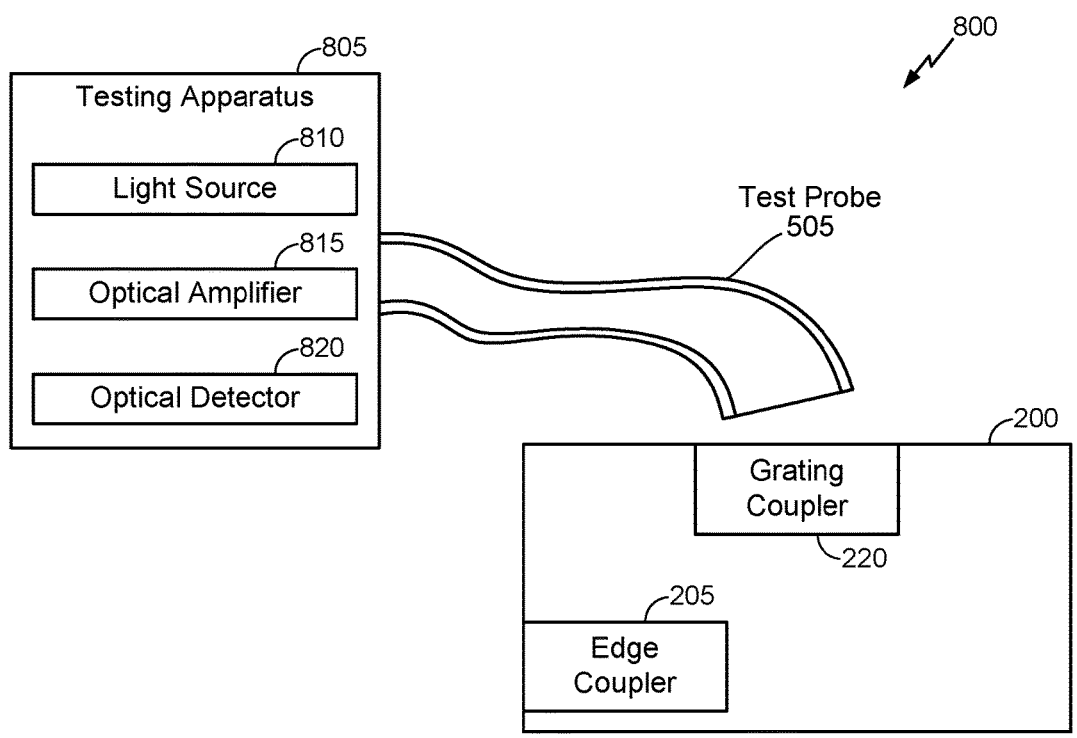
FIG. 8 illustrates a system for testing a photonic chip, according to an example.

FIG. 8 illustrates a system 800 for testing the photonic chip 200, according to an example. The system 800 includes a testing apparatus 805 which can be used to perform various parts of method 600. The testing apparatus 805 includes a light source 810, an optical amplifier 815, and an optical detector 820. Further, the testing apparatus 805 is coupled to a test probe 505 (e.g., a fiber optic cable) which is in turn optically coupled to the grating coupler 220 in the photonic chip 200. The test probe 505 permits the testing apparatus to receive optical signals from and transmit optical signal to the grating couplers 220.

The light source 810 may be a laser that generates an optical signal that can be transmitted into the grating coupler 220 to test the functionality of the chip 200. Although not shown, the laser source 810 may also include a modulator for inserting data into a modulated optical signal using, e.g., pulse amplitude modulation (PAM), quadrature amplitude modulation (QAM), quadrature phase shift keying (QPSK), and the like. Using a modulation scheme, the testing apparatus can insert data into the optical signal transmitted to the photonic chip which can in turn be used to test an optical component in the chip 200.

The optical amplifier 815 can amplify optical signals received from the photonic chip 200 via the grating coupler 220. As mentioned above, the grating coupler 220 may receive an attenuated version of the optical signals propagating in the photonic chip 200. The optical amplifier 815 can amplify the received optical signal so that, e.g., the optical detector 820 can detect the signal to measure its power, frequency, phase, or demodulate the signal to identify data in the received optical signal.

The testing apparatus 805 can be used to test optical components when the photonic chips 200 are still in a wafer as shown in FIG. 7 or after the photonic chips 200 have been separated. Further, the grating coupler 220 can be used to aid when aligning a fiber optic cable to the edge coupler 205. For example, the testing apparatus 805 may output the intensity of the optical signal measured at the grating coupler 220 to an alignment apparatus which may adjust the relative position of the fiber optic cable to the edge coupler 205.

Returning to method 600, at block 610 the testing apparatus identifies the functional photonic chips on the wafer based on the testing performed at block 610. For example, the testing apparatus may store in memory a map of the wafer which indicates which of the photonic chips passed the test (or tests) and which did not. The chips that failed the test can be marked so that these chips are discarded or recycled.

At block 615, the wafer is sawed into the individual photonic chips which may expose the edge couplers on the sawed sides of the chips. Although not shown, other fabrication steps such as polishing the sides of the photonic chips maybe performed.

At block 620, the functional photonic chips are mounted onto a substrate (e.g., a semiconductor or dielectric substrate). Moreover, the functional photonic chips may be disposed in an electronic system that includes other semiconductor chips. For example, the photonic chip may be connected to a printed circuit board (PCB) along with other photonic chips or electrical ICs. Furthermore, the photonic chips may be coupled to the electrical ICs so that electrical signals can be driven into, or received from, the photonic chip.

At block 620, the testing apparatus tests the mounted functional photonic chips using the grating couplers. In one embodiment, the edge couplers may not have been aligned to fiber optic cables, and thus, the grating couplers may provide the only access to certain optical components in the photonic chip. This may be preferred so that the chip is tested in the same manner after the chip has been mounted as when the chip was part of the wafer.

At block 630, optical fibers are aligned to the edge couplers in the mounted photonic chip using light received from the grating couplers. As described above, the optical fibers may emit light when being aligned. Some of the emitted light is received by the edge coupler and directed to the grating coupler via the splitter. The testing apparatus receives the light from the grating coupler and can report the intensity of the light to an alignment apparatus. In response, the alignment apparatus can change the relative position of the optical fiber (or fibers) to the one or more edge couplers.

In another embodiment, the grating couplers are used to test the photonic chip even if the edge couplers in the chip are aligned to fiber optic cables. Put differently, the testing apparatus may still use the grating couplers to test the chip even if light can be emitted into, or received from, the edge couplers. This may be preferred so that the chip is tested in the same manner after the chip has been mounted as when the chip was part of the wafer.

In one embodiment, after the grating couplers are used to test the functionality of the photonic chip and/or align the edge couplers, the couplers may be covered up. For example, the grating couplers may not be used in normal operation of the photonic chip when mounted in an optical device and a non-transparent material may be deposited over the grating coupler.

Figure 9:
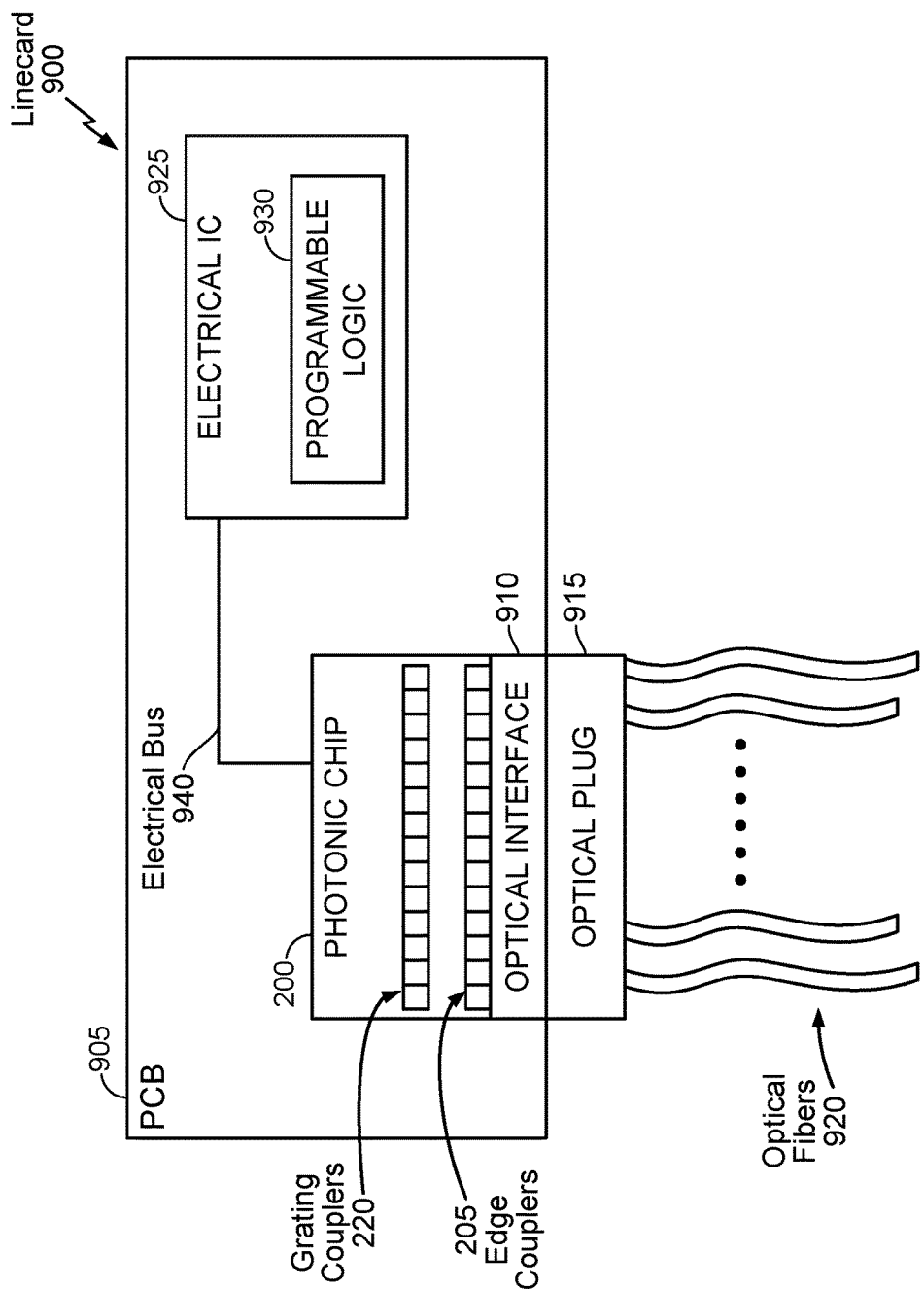
FIG. 9 illustrates a linecard that includes a photonic chip, according to an example.

FIG. 9 illustrates a linecard 900 that includes the photonic chip 200, according to an example. In one embodiment, the linecard 900 may be used in a computing system such as a network device (e.g., a router) or a server. As shown, the photonic chip 200 is mounted on a PCB 905 along with an electrical IC 925 which is coupled to the photonic chip 200 by an electrical bus 940. The electrical bus 940 facilitates data communication between components in the photonic chip 200 and the logic in the electrical IC 925. In this example, the electrical IC 925 includes programmable logic 930 which can be configured or changed to perform different functions. For example, the electrical IC 925 may be programmable IC or an FPGA. In another embodiment, instead of using a bus 940, the electrical IC 925 may be directly bonded to conductive pads on the photonic chip 200 (e.g., using a flip-chip technique). In yet another embodiment, the programmable logic 930 can be disposed in the SOI structure of the photonic chip 200 to form a single integrated chip in which case the bus 940 may be omitted.

The photonic chip 200 includes a plurality of grating couplers 220 and edge couplers 205. The grating couplers 220 may be disposed in a line or an array so that a testing apparatus can optically couple a group of test probes to the grating couplers 220 simultaneously. In one embodiment, the grating couplers 220 are exposed on a top surface of the photonic chip 200 while the edge couplers 205 are disposed on a side surface of the chip 200 that is perpendicular to the top surface. The edge couplers 205 are coupled to an optical interface 910 which is connected to an optical plug 915 and optical fibers 920. In this embodiment, the optical fibers 920 can be plugged into the optical interface 910 which aligns the fibers 920 with a respective one of the edge couplers 205. However, in another embodiment, the optical fibers 920 may be directly aligned and fixable coupled to the edge couplers 205 using, e.g., an epoxy or resin.

In one embodiment, the optical fibers 920 only transmit optical signals into, or receive optical signals from, the photonic chip 200. In another embodiment, the optical fibers 920 both transmit and receive optical signal with the photonic chip 200 simultaneously. For example, ingress optical signals may be transmitted using a first range of wavelengths while egress optical signal are transmitted using a second, non-overlapping range of wavelengths. As such, the optical fibers 920 can transmit optical signals away from the photonic chip 200 at the same time optical signals are transmitted to the photonic chip 200.

Figure 10:
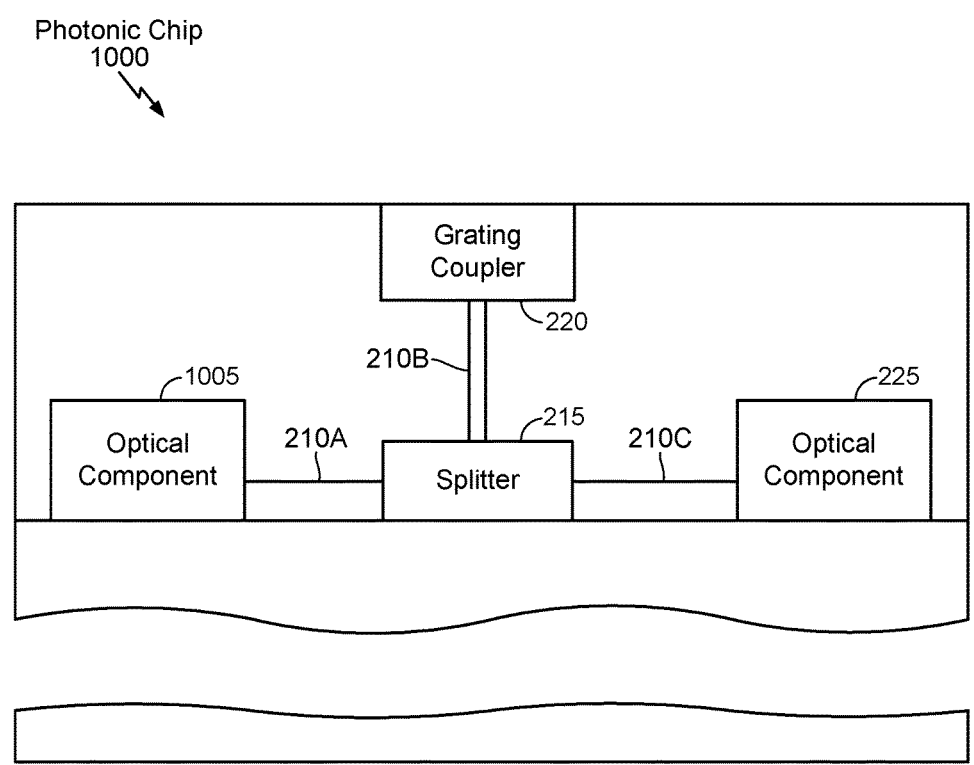
FIG. 10 illustrates a photonic chip that includes a grating coupler, according to an example.

FIG. 10 illustrates a photonic chip 1000 that includes the grating coupler 220, according to an example. Unlike in photonic chip 200 in FIG. 2, here, the splitter 215 is not coupled to an edge coupler. Instead, the grating coupler 220 can be used to test optical component 1005 and optical component 225. For example, the two optical components 10005 and 225 may be optical modulators. By placing the splitter 215 between the modulators, the grating coupler 220 permits a testing apparatus to receive light transmitting between the modulators which can be used to test the functionality of the modulators. In another embodiment, the testing apparatus can use the grating coupler 220 to transmit an optical signal to at least one of the optical components 10005 and 225. Thus, a splitter 215 and grating coupler 220 can be fabricated into the photonic chip 1000 at any location in the chip 1000 to test any optical component or structure in the chip 1000.

While the foregoing is directed to specific examples, other and further examples may be devised without departing from the basic scope thereof, and the scope thereof is determined by the claims that follow.

What is claimed is:

1. A photonic semiconductor chip, comprising:
   an edge coupler directly coupled to a first end of a first waveguide, wherein the edge coupler is arranged to transfer first optical signals along a side plane of the photonic semiconductor chip, wherein the edge coupler is configured to change a mode size as the first optical signals propagate through the edge coupler;
   a splitter directly coupled to (i) a second end of the first waveguide, (ii) a first end of a second waveguide, and (iii) a first end of a third waveguide, wherein the splitter is configured to receive a first optical signal from one of the first, second, and third waveguides and transmit first and second attenuated portions of the first optical signal onto the remaining two of the first, second, and third waveguides;
   a grating coupler directly coupled to a second end of the second waveguide, wherein the grating coupler is arranged to transfer second optical signals along a top plane of the photonic semiconductor chip that is perpendicular to the side plane; and
   an optical component coupled to a second end of the third waveguide.

2. The photonic semiconductor chip of claim 1, wherein the edge coupler is exposed on an external side surface of the photonic semiconductor chip and the grating coupler is exposed on an external top surface of the photonic semiconductor chip, wherein the side surface is perpendicular to the top surface.

3. The photonic semiconductor chip of claim 2, wherein the optical component is connected via a conductive trace to a conductive pad disposed on the top surface.

4. The photonic semiconductor chip of claim 1, wherein the first, second, and third waveguides have at least one dimension less than a micron, and wherein the first, second, and third waveguides are disposed on a common plane in the photonic semiconductor chip.

5. The photonic semiconductor chip of claim 4, wherein the common plane is an interface between a top semiconductor surface layer of the photonic semiconductor chip and an insulation layer of the photonic semiconductor chip, wherein the first waveguide, the second waveguide, the third waveguide, the edge coupler, and the grating coupler are disposed on the insulation layer.

6. The photonic semiconductor chip of claim 1, wherein the optical component is one of an optical detector and optical modulator.

7. The photonic semiconductor chip of claim 1, further comprising a silicon-on-insulator (SOI) structure, wherein the first, second, and third waveguides are silicon waveguides disposed on an insulation layer in the SOI structure.

8. A method, comprising:
   providing a photonic semiconductor chip comprising an edge coupler, a grating coupler, a splitter, and an optical component, wherein the edge coupler is directly coupled to a first end of a first waveguide, the splitter is directly coupled to (i) a second end of the first waveguide, (ii) a first end of a second waveguide, and (iii) a first end of a third waveguide, the grating coupler is directly coupled to a second end of the second waveguide, and the optical component is coupled to a second end of the third waveguide;
   transferring an optical signal between a test probe and the grating coupler, wherein the edge coupler is arranged to transfer first optical signals along a side plane of the photonic semiconductor chip and the grating coupler is arranged to transfer second optical signals along a top plane of the photonic semiconductor chip that is perpendicular to the side plane; and
   testing the functionality of the optical component based on transferring the optical signal.

9. The method of claim 8, the method further comprising:
   providing a wafer comprising the photonic semiconductor chip, wherein transferring the optical signal occurs when the photonic semiconductor chip is part of the wafer, wherein the wafer includes a plurality of photonic semiconductor chips.

10. The method of claim 9, further comprising:
    cutting the wafer to separate the photonic semiconductor chip from the plurality of photonic semiconductor chips thereby exposing the edge coupler on an external side surface of the photonic semiconductor chip.

11. The method of claim 10, further comprising:
    receiving light transmitted by an external carrying medium at the edge coupler;
    measuring the received light at the grating coupler using the test probe; and
    aligning the external carrying medium to the edge coupler based on the measured light.

12. The method of claim 10, wherein the grating coupler is exposed on an external top surface of the photonic semiconductor chip, wherein the external side surface is perpendicular to the external top surface.

13. The method of claim 12, wherein the optical component is connected via a conductive trace to a conductive pad disposed on the top surface.

14. The method of claim 9, wherein the first, second, and third waveguides have at least one dimension less than a micron, and wherein the first, second, and third waveguides are disposed on a common plane in the photonic semiconductor chip.

15. A method, comprising:
    providing a wafer comprising a plurality of photonic chips integrated into the wafer, wherein a first photonic chip of the plurality of photonic chips comprises a grating coupler, a splitter, a first optical component, and an edge coupler, wherein the grating coupler is directly coupled to a first end of a first waveguide, the splitter is directly coupled to (i) a second end of the first waveguide, (ii) a first end of a second waveguide, and (iii) a first end of a third waveguide, the first optical component is coupled to a second end of the second waveguide, and the the edge coupler is directly coupled to a second end of the third waveguide;
    transferring an optical signal between a test probe and the grating coupler, wherein the grating coupler is arranged to transfer the optical signal along a top plane of the first photonic chip that is parallel to a common plane on which the first and second waveguides are disposed;
    testing the functionality of the first optical component based on transferring the optical signal; and
    cutting the wafer to separate the first photonic chip from the plurality of photonic chips.

16. The method of claim 15, wherein the splitter is configured to receive a first optical signal from one of the first and second, and third waveguides and transmit first and second attenuated portions of the first optical signal onto the remaining two of the first, second, and third waveguides.

17. The method of claim 15, wherein the first optical component is connected via a conductive trace to a conductive pad disposed on the top plane.

18. The method of claim 15, wherein the first, second, and third waveguides have at least one dimension less than a micron, and wherein the first, second, and third waveguides are disposed on a common plane in the photonic chip.

19. The method of claim 15, further comprising, after cutting the wafer:
- checking the functionality of the first optical component by transferring a second optical signal between the grating coupler and the test probe.

20. The method of claim 15, further comprising after cutting the wafer:
- covering up the grating coupler with a non-transparent material.

\* \* \* \* \*